US006944838B2

(12) United States Patent
McMillan

(10) Patent No.: US 6,944,838 B2
(45) Date of Patent: Sep. 13, 2005

(54) METHOD AND SYSTEM FOR DESIGN VERIFICATION USING PROOF-PARTITIONING

(75) Inventor: Kenneth L. McMillan, Berkeley, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/357,657

(22) Filed: Feb. 3, 2003

(65) Prior Publication Data

US 2004/0153983 A1 Aug. 5, 2004

(51) Int. Cl.[7] .............................................. G06F 9/45
(52) U.S. Cl. ...................... 716/5; 716/4; 703/2; 703/14
(58) Field of Search ............................ 716/4, 5; 703/2, 703/14

(56) References Cited

U.S. PATENT DOCUMENTS

| 5,440,568 | A | | 8/1995 | Foster | |
|---|---|---|---|---|---|
| 6,698,003 | B2 | * | 2/2004 | Baumgartner et al. | 716/4 |
| 6,848,088 | B1 | * | 1/2005 | Levitt et al. | 716/4 |
| 2002/0138812 | A1 | * | 9/2002 | Johannsen | 716/5 |
| 2003/0225552 | A1 | * | 12/2003 | Ganai et al. | 703/2 |
| 2004/0019468 | A1 | * | 1/2004 | De Moura et al. | 703/2 |

OTHER PUBLICATIONS

Liang et al., "Incremental deductive & inductive reasoning for SAT–based bounded model checking", Nov. 7–11, 2004, Computer Aided Design, 2004. ICCAD–2004. IEEE/ACM International Conference on , pp: 502–509□□.*
Gupta et al., "Iterative abstraction using SAT–based BMC with proof analysis", Nov. 9–13, 2003, Computer Aided Design, 2003. ICCAD–2003. International Conference on , pp: 416–423.*

Bjeese et al., "Using counter example guided abstraction refinement to find complex bugs", Feb. 16–20, 2004, Design, Automation and Test in Europe Conference and Exhibition, 2004. Proceedings, vol.: 1 , pp: 156–161 vol. 1.*
Fraer et al., "Accelerated verification of RTL assertions based on satisfiability solvers", Oct. 27–29, 2002, High–Level Design Validation and Test Workshop, 2002. Seventh IEEE International , , pp.: 107–110.*
Jussila et al., "BMC via dynamic atomicity analysis", Jun. 16–18, 2004 , Application of Concurrency to System Design, 2004. ACSD 2004. Proceedings. Fourth International Conference on , pp.: 197–206.*
Kuehlmann et al., "Dynamic transition relation simplification for bounded", Nov. 7–11, 2004, Computer Aided Design, 2004. ICCAD–2004. IEEE/ACM International Conference on , pp.: 50–57.*

(Continued)

*Primary Examiner*—A. M. Thompson
*Assistant Examiner*—Helen Rossoshek
(74) *Attorney, Agent, or Firm*—Blakely, Sokoloff, Taylor & Zafman LLP

(57) ABSTRACT

A design verifier includes a bounded model checker, a proof partitioner and a fixed-point detector. The bounded model checker verifies a property to a depth K and either finds a counterexample, or generates a proof in the form of a directed acyclic graph. If a counterexample is found, the bounded model checker selectively increases K and verifies the property to the new larger depth using the original constraints. If no counterexample is found, the proof partitioner provides an over-approximation of the states reachable in one or more steps using a proof generated by the bounded model checker. The fixed-point detector detects whether the over-approximation is at a fixed point. If the over-approximation is at a fixed-point, the design is verified. If the over-approximation is not at a fixed point, the bounded model checker can iteratively use over-approximations as a constraint and verify the property to a depth K.

30 Claims, 6 Drawing Sheets

OTHER PUBLICATIONS

Vedula et al., "Program slicing for ATPG–based property checking", 2004, VLSI Design, 2004. Proceedings. 17th International Conference on , pp.: 591–596.*

Gupta et al., "Learning from BDDs in SAT–based bounded model checking", Jun. 2–6, 2003, Design Automation Conference, 2003. Proceedings , pp.: 824–829.*

Clarke et al., "Tree–like counterexamples in model checking", Jul. 22–25, 2002, Logic in Computer Science, 2002. Proceedings. 17th Annual IEEE Symposium on , pp.: 19–29.*

McMillan et al., "Methods for exploiting SAT solvers in unbounded model checking", Jun. 24–26, 2003, Formal Methods and Models for Co–Design, 2003. MEMOCODE '03. Proceedings. First ACM and IEEE International Conference on, pp.:135–142.*

U.S. Appl. No. 60/397,201.*

McMillan et al., "Methods for exploiting SAT solvers in unbounded model checking", Jun. 2003, First ACM and IEEE International conference, pp.: 135–142.*

Cabodi et al.; "Can BDDs compete with SAT solvers on Bounded Model Checking?", Jun. 2002, Design automation conference, Pges.: 117–122.*

U.S. Appl. No. 60/397,201 filed Jul. 19, 2002.*

Cabodi, Gianpiero et al., "Can BDDs Compete With SAT Solvers on Bounded Model Checking?", DAC 2002, Jun. 10–14, 2002, New Orleans, Louisiana, USA, Copyright 2002 ACM 1–58113–461–04/02/0006, Abstract.

Biere, Armin, "Verifying Sequential Behavior with Model Checking", Computer Systems Institute, ETH Zürich, Switzerland, Abstract.

Clarke, Edmund et al., "Bounded Model Checking Using Satisfiability Solving", Computer Science Department, CMU, Abstract.

A. Biere, C. Artho, V. Schuppan, "Liveness Checking as Safety Checking," Electronic Notes in Theoretical Computer Science 66 No. 2 (2002), 18 pages.

D. A. Plaisted, S. Greenbaum, "A Structure–preserving Clause Form Translation," J. Symbolic Computation (1986) 2, Academic Press Inc. (London Ltd.), pp. 293–304.

K. L. McMillan, N. Amla, "Automatic Abstraction with Counterexamples," Cadence Design Systems, LNCS 2619, 2003, pp. 2–17.

M. W. Moskewicz, C. F. Madigan, "Chaff: Engineering an Efficient SAT Solver," in Design Automation Conference, 2001, pp. 530–535.

P. Pudlak, "Lower Bounds for Resolution and Cutting Plane Proofs and Monotone Computations," The Journal of Symbolic Logic, vol. 62, Number 3, Sep. 1997, pp. 981–998.

M. Sheeran, S. Singh, G. Stalmarck, "Checking Safety Properties Using Induction and a SAT–Solver,"in Formal Methods in Computer Aided Design, 2000, pp. 108–125.

L. Zhang, S. Malik, "Validating SAT Solvers Using an Independent Resolution–Based Checker: Practical Implementations and Other Applications," In DATE '03, pp. 880–885, 2003.

J.R. Burch, E.M. Clark, K.L. McMillan, D.L. Dill, "Sequential Circuit Verification Using Symbolic Model Checking," Proc. Design Automation Conf., Orlando, FL, Jun. 1990, pp. 46–51.

J.R. Burch, E.M. Clark, K.L. McMillan, D.L. Dill, L.J. Hwang, "Symbolic Model Checking: 1020 States and Beyond," in Proceedings of the Fifth Annual IEEE Symposium on Logic in Computer Science, pp. 1–33, Washington, D.C., 1990, IEEE Computer Society Press.

A. Gupta, Z. Yang, P. Ashar, A. Gupta, "SAT–Based Image Computation with Application in Reachability Analysis," in FMCAD 2000, pp. 354–371, 2000.

J. Baumgartner, A. Kuehlmann, J. Abraham, "Property Checking via Structural Analysis," in Computer–Aided Verification (CAV 2002), pp. 151–165.

A. Biere, A. Cimatti, E. Clark, Y. Zhu, "Symbolic Model Checking Without BDDs," in TACAS '99, vol. 1579 of LNCS, pp. 193–207.

P. Bjesse, "Symbolic Model Checking with Sets of States Represented as Formulas," Technical Report CS–1990–100, Department of Computer Science, Chalmers Technical University, Mar. 1999, 17 pages.

P.A. Abdulla, P. Bjesse, N. Een, "Symbolic Reachability Analysis Based on SAT–Solvers," in TACAS 2000, vol. 1785 of LNCS, Springer–Verlag, pp. 411–425.

P. Bjesse, T. Leonard, A. Mokkedem, "Finding Bugs in an Alpha Microprocessor Using Satisfiability Solvers," Chalmers University of Technology, Sweden, 2001, pp. 454–464.

R. Bryant, "Graph–Based Algorithms for Boolean Function Manipulation," IEEE Transactions on Computers, vol. C–35, No. 8, Aug. 1986, pp. 677–691.

O. Courdert, C. Berthet, J. C. Madre, "Verification of Synchronous Sequential Machines Based on Symbolic Execution," BULL Research Center, P.C. 58B, 68 Route de Varsailles, 78430 Louveciennes, France, pp. 365–373.

F. Copty, L. Fix, R. Fraer, E. Giunchiglia, G. Kamhi, A. Tacchella, M. Y. Vardi, "Benefits of Bounded Model Checking at an Industrial Setting," Formal Property Verifications, Intel Corporation, Haifa, Israel, CAV 2001, LNCS 2102, 2001, pp. 436–453.

E. Goldberg, Y. Novikov, "BerkMin: a Fast and Robust Sat–Solver," 2002, pp. 142–149.

O. Kupferman, M.Y. Vardi, "Model Checking of Safety Properties," Formal Methods in System Design, 19, 2001, pp. 291–314.

J. P.M. Silva, K.A. Sakallah, "GRASP–A New Search Algorithm for Satisfiability," 1996 IEEE, pp. 220–227.

M.Y. Vardi, P. Wolper, "An Automata–Theoretic Approach to automatic Program Verification (Preliminary Report)," IBM research, AT&T Bell Laboratories, 1986 IEEE, pp. 332–344.

P.F. Williams, A. Biere, E.M. Clarke, A. Gupta, "Combining Decision Diagrams and SAT Procedures for Efficient Symbolic Model Checking," Semiconductor Research Corporation, CAV 2000, LNCS 1855, pp. 124–138.

W. Craig, "Linear Reasoning. A New Form of the Herbrand––Gentzen Theorem." Journal of Symbolic Logic, vol. 22, No. 3, Sep. 1957, pp. 250–268.

O. Lichtenstein, A. Pnueli, "Checking That Finite State Concurrent Programs Satisfy Their Linear Specification," Principles of Programming Languages (POPL 85), 1985, pp. 97–107.

A. Pnueli, L. Zuck, "Probabilistic Verification by Tableaux," Department of Computer Science, The Weizmann Institute of Science, Rehovot 76100, Israel, 1986 IEEE, pp. 322–331.

K. L. McMillan, "Interpolation and SAT–based Model Checking," Cadence Berkeley Labs, CAV 2003, Jul. 8, 2003, 13 pages.

K. L. McMillan, "Symbolic Model Checking," Carnegie Mellon University, Kluwer Academic Publishers, 1993, pp. 25–39.

E. Clarke, A. Biere, R. Raimi, Y. Zhu, "Bounded Model Checking Using Satisfiability Solving," Semiconductor Research Corporation, National Science Foundation, pp. 1–20.

A. Biere, A. Cimatti, E. M. Clarke, OF. Strichman, Y. Zhu, "Bounded Model Checking," Semiconductor Research Corporation, National Science Foundation, Army Research Office, Office of Naval Research, Naval Research Laboratory, 27 pages.

A. Biere, "Verifying Sequential Behavior with Model Checking," Computer Systems Institute, ETH Zurich, ETH Zentrum, RZ H, CH–8092 Zurich, Switzerland, 4 pages.

* cited by examiner

METHOD AND SYSTEM FOR DESIGN VERIFICATION USING PROOF-PARTITIONING

FIELD OF THE INVENTION

Embodiments of the invention relate generally to design verification and more specifically but not exclusively to design verification using proofs generated from bounded model checkers.

BACKGROUND INFORMATION

In designing large dynamic systems such as, for example, a complex electronic circuit, the design is often analyzed to verify a selected property. For example, the design may need to be analyzed to verify that the system does not enter a certain state under any normal set of inputs to the system in any finite number of steps (e.g., a safety property).

One conventional approach is to use a bounded model checker that can verify whether the system will not enter a preselected state. For example, several Boolean satisfiability solvers (also referred to as SAT solvers) are known that can determine whether the system enters the state within a selected number of steps. Typically, the SAT solver searches for a counterexample (i.e., a set of inputs to the system that will cause the system to enter the preselected state within the selected number of steps). Thus, if the SAT solver finds a counterexample within K steps, the system can enter the preselected state. The designer can then redesign the system to ensure that the preselected state is not entered.

"However, even if the SAT solver cannot find a counterexample in K steps, there is still a chance that the system will enter the preselected state in greater than K steps. Thus, the design is only partially verified for the selected property. This "partial" verification is unacceptable in many applications."

Another approach is to use an unbounded model checker that exhaustively calculates whether the system can enter the preselected state in any number of steps. However, this approach is only practical for relatively small systems because the number of states increases exponentially with the number of state variables (i.e., the so-called state explosion problem).

One modification of this approach is to use an abstraction of the design in the unbounded model checker. Subsequent abstractions are based on an analysis of the counterexample found in the previous iteration of the unbounded model checker. Typically, a constraint is introduced that prevents the counterexample from occurring. This approach tends to result in a relatively inefficient abstraction because the abstraction is an accumulation of the constraints introduced for each counterexample that was found in previous iterations. These added constraints may not be relevant to the preselected property, but there is no mechanism in this approach for removing an irrelevant constraint from the abstraction.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

In the following detailed description, numerous specific details are set forth. However, it is understood that embodiments of the invention may be practiced without these specific details. In other instances, well-known circuits, structures, and techniques have not been shown in detail in order to not obscure the understanding of this description. These embodiments are described in sufficient detail to enable those of ordinary skill in the art to practice the invention. The following detailed description is, therefore, not to be taken in a limiting sense, and the scope of the invention is defined only by the appended claims.

Figure 1:
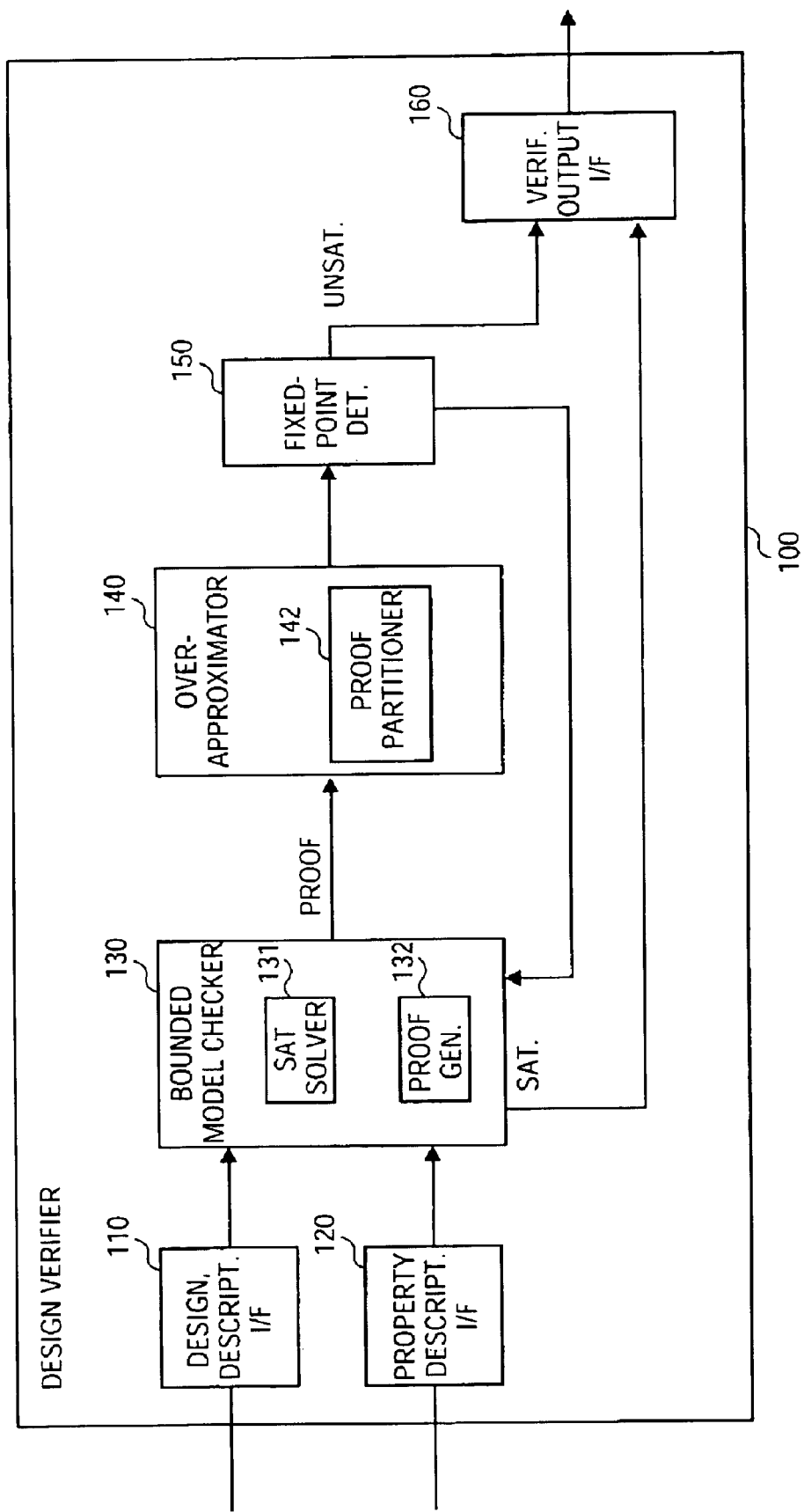
FIG. 1 is a block diagram illustrating modules implementing a design verifier according to one embodiment of the present invention.

FIG. 1 illustrates a design verifier 100 according to one embodiment of the present invention. In this embodiment, design verifier 100 is implemented using machine-readable instructions that cause a machine (e.g., a computer or work station) to perform operations that allow the machine to receive a design description of a system (e.g., a design description of an electronic circuit) and verify whether a property (or properties) of the design is satisfied.

In this embodiment, design verifier 100 includes modules implementing a design description interface 110; a property description interface 120; a bounded model checker 130 having a SAT solver component 131 and a proof generator 132; an over-approximator 140 having a proof partitioner 142; a fixed-point detector 150; and a verification output interface 160. In one embodiment, these modules are implemented using machine-readable instructions.

Design description interface 110 and property description interface 120, in this embodiment, are configured to receive Boolean design and property descriptions from a source (or sources) external to the interfaces 110 and 120 (e.g., a file) and to provide output to bounded model checker 130. Bounded model checker 130 is configured to provide output to over-approximator 140, which in turn is configured to provide output to fixed-point detector 150. Fixed-point detector 150 is configured to selectively provide output to bounded model checker 130 and to verification output interface 160. Verification output interface 160 is also configured to receive output from bounded model checker 130. The operational flow of design verifier 100 is described below.

Figure 2:
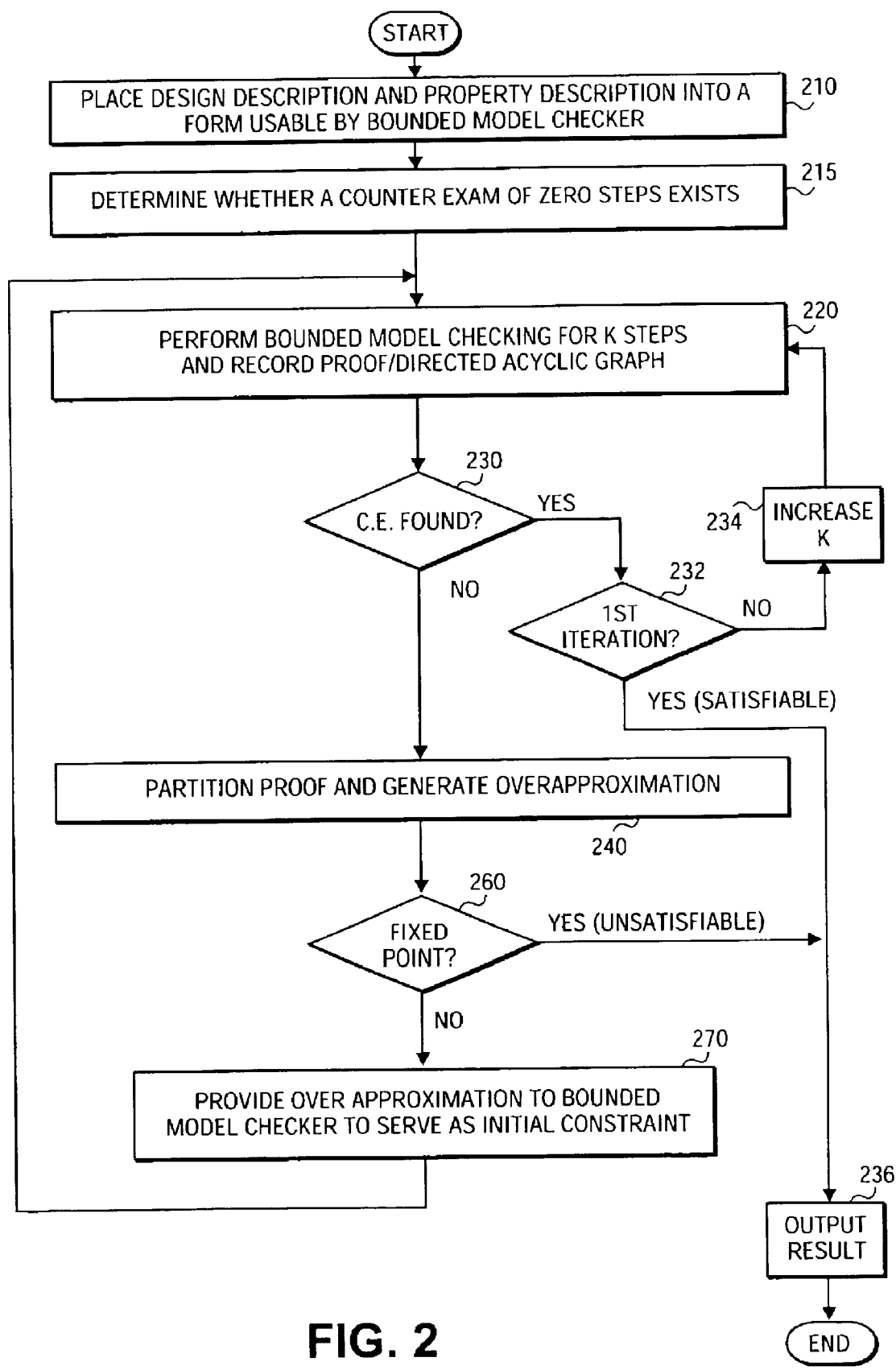
FIG. 2 is a flow diagram illustrating an operational flow of the design verifier of FIG. 1, according to one embodiment of the present invention.

FIG. 2 illustrates an operational flow of design verifier 100 (FIG. 1), according to one embodiment of the present invention. Referring to FIGS. 1 and 2, design verifier operates as follows.

In a block 210, Boolean design and property descriptions are placed into a form that is usable by bounded model checker 130. In this embodiment, design description interface 110 and property description interface 120 are configured to transform the Boolean descriptions into a form usable by bounded model checker 130. For example, interfaces 110 and 120 can receive a file or files containing the Boolean design and property descriptions and output a series of constraints over variables representing the design state. In a typical application, each variable represents the current electrical state of a wire or node in a digital circuit, or its subsequent state after one step, or clock cycle. Each constraint typically represents the action of a single gate or register in the design. Additional constraints are generated to characterize the initial state (typically the reset state of a circuit) and the final state (i.e., the state that violates the given property).

In this embodiment, a constraint is a Boolean formula. In addition, the constraints may be transformed into conjunctive normal form (CNF) in order to provide suitable input for bounded model checker 130. A formula in CNF is a conjunction (logical AND) of clauses. Each clause is in turn a disjunction (logical OR) of literals. Each literal is either a variable or its negation (logical NOT). In some alternative embodiments, the functions of design description interface 110 and property description interface 120 are combined in a single module.

In a block 215, well-established SAT methods are used to determine whether the conjunction of the initial constraint and the final constraint is satisfiable. If this is the case, then there is a counterexample of 0 steps (i.e., the property is false in the initial state) and the operational flow proceeds to a block 236, in which this indication can be provided to the operator via verification output interface 160 (this operation is omitted in FIG. 2 to promote clarity). Otherwise, the operational flow proceeds to a block 220.

In block 220, bounded model checker 130 performs a bounded model-checking algorithm on the transformed design and property description to a depth of K steps. In one embodiment, bounded model checker 130 has a component 131 that is substantially similar to a conventional SAT solver. In this embodiment, bounded model checker 130 generates a set of clauses in the following way. It first generates K+1 copies of the set of variables representing the design state. We will refer to these sets of variables as sets $S_0 \ldots S_K$.

An instance of the initial constraint is then generated by replacing each state variable in the initial constraint with the corresponding variable in the set $S_0$. The resulting clauses are added to the clause set. Further, for each time T in the range $0 \ldots K-1$, an instance of the transition constraint is generated by replacing each "current state" variable in the transition constraint with corresponding variable in the set $S_T$. Also, each "next state" variable in the transition constraint is replaced with the corresponding variable in the set $S_{T+1}$. The resulting clauses are added to the clause set.

Finally, for each time T in the range $1 \ldots K$, an instance of the final constraint is generated by replacing each variable in the final constraint with the corresponding variable in the set $S_T$. The disjunction of these K instances is translated into CNF form and the resulting clauses are added to the clause set.

The clause set thus obtained is suitable as input to the SAT solver component of bounded model checker 130. If SAT solver component 131 determines that this clause set is satisfiable, then there is a counterexample of $1 \ldots K$ steps. Bounded model checker 130 analyzes the satisfying assignment produced as output by SAT solver component 131 to generate the counterexample. In particular, the state of the design at time T in the counterexample is determined by the valuation of variable set $S_T$ in the satisfying assignment. This counterexample is provided as output of bounded model checker 130.

On the other hand, if SAT solver component 131 determines that the clause set is unsatisfiable, then there is no counterexample of $1 \ldots K$ steps and this condition is indicated as output of bounded model checker 130. If no counterexample was found, bounded model checker 130 by itself cannot determine whether no counterexamples would exist if the process were carried out for greater than K steps.

In addition, in accordance with embodiments of the present invention, bounded model checker 130 includes proof generator 132. In this embodiment, proof generator 132 is configured to record the inferences generated by SAT solver component 131 (as described in more detail below in conjunction with FIG. 3). In one embodiment, a conventional SAT solver (e.g., the well-known Davis Loveland and Logemann (DPLL) SAT solver, or other suitable SAT solver from which a refutation proof can be generated) is modified to store the inferences it generates during the phase known as conflict clause generation. Other embodiments use different bounded model checkers that generate inferences that can be recorded.

In a decision block 230, the result from the bounded model checking is analyzed to determine if bounded model checker 130 found a counterexample. If a counterexample was found in K steps, the operational flow proceeds to another decision block 232 to determine whether the counterexample is a valid one. In the first iteration of the loop for the current value of K, the initial constraint is unchanged from the original design description, and thus the counterexample is a valid one for the original design (i.e., a design error was found). In block 236, this indication can be provided to the operator via verification output interface 160. This information can then be passed to the designers for redesign as desired.

However, if in block 232 it is determined that the counterexample was found after the first iteration for the current value of K, the operational flow proceeds to a block 234 in which K is increased, and the initial constraint is restored to its original value, before looping back to block 220. In this embodiment, K is increased and a new bounded model check is performed because the counterexample found in block 220 is not based on the actual design and property descriptions received via interfaces 110 and 120. Rather, the counterexample was found using an over-approximation of the reachable state set of the design (described below) as the initial constraint, and thus may be a false counterexample.

In some embodiments, K is increased by one step. However, in other embodiments, K may be increased by more than one step. Further, the increase in K may be either uniform or variable. For example, K may be increased by the number of unsatisfiable bounded model checking iterations executed for the current value of K. It can be shown that no counterexample exists for lower values of K.

Referring back to block 230, if no counterexample was found, the operational flow proceeds to a block 240. In block 240, over-approximator 140 divides the clause set of block 130 into two disjoint subsets. The first subset, which we will refer to as subset A, contains those clauses derived from the initial constraint and the first instance of the transition constraint. The second subset, which we will refer to as subset B, contains the remaining clauses (those clauses derived from the final constraint and the remaining instances of the transition constraint (see FIG. 2A for an example). By this construction, the only variables in common between subsets A and B are the variables in set $S_1$. We will also refer to these as the "common variables".

The proof of unsatisfiability is then analyzed by proof partitioner 142 (as described in detail below) in order to derive a formula P. This formula has the properties: (a) it is logically implied by subset A; (b) it refers only to the common variables, and (c) its conjunction with subset B is unsatisfiable. The first two of these properties guarantee that the set of valuations of set $S_1$ satisfying formula P is an over-approximation of the set of states reachable from the initial states in one step. The third property guarantees that states of set $S_1$ satisfying formula P cannot reach the final states (and hence make the property false) in 0 ... K–1 steps. One embodiment of block 240 is described below in more detail in conjunction with FIG. 4.

"In block 260, the resulting over-approximation formula P is analyzed to determine if a fixed point has been reached. In this embodiment, fixed-point detector 150 determines whether the fixed point has been reached by testing whether formula P logically implies the disjunction of the original initial constraint and all the previous over-approximations, if any, for the current value of K. This test can be made by SAT solver component 131 using well-established methods."

It can be shown by induction that if a fixed-point has been reached, the final state is unreachable for any number of steps. Thus, if a fixed-point is detected in block 260, the operational flow proceeds to block 236 in which an indication is provided to the operator, via verification output interface 160, that the property is true for the given design.

If however, in block 260, a fixed-point is not detected, the operational flow proceeds to a block 270 in which the initial constraint is replaced by the most recent over-approximation. If necessary, this formula may be transformed into conjunctive normal form (CNF) in order to provide suitable input for bounded model checker 130. The operational flow then loops back to block 220 for another iteration of bounded model checking without changing the value of K.

Figure 2A:
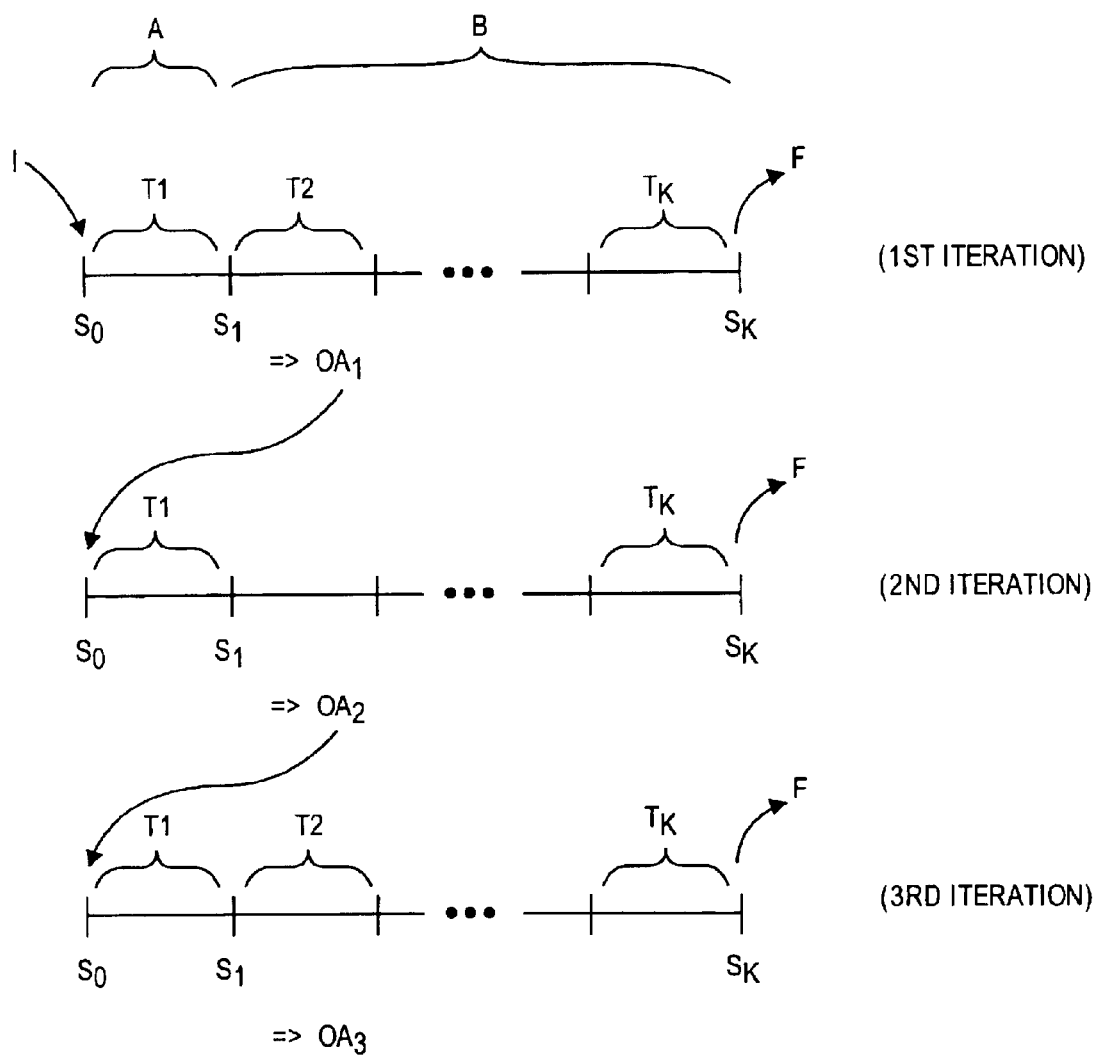
FIG. 2A is a diagram illustrating an exemplary multi-iteration process, according to one embodiment of the present invention.

It can be shown that if the property is true (i.e., if there is no counterexample), the process must converge to a fixed point for any value of K larger than the reverse depth of the state space (which is bounded from above by the diameter of the state space). Thus, the process will repeat until either a fixed point is reached or a counterexample is found in the first iteration for a given value of K (i.e., block 232). FIG. 2A illustrates the operation of three successive iterations of this procedure.

Referring to FIGS. 1, 2 and 2A, in the first iteration, a clause set is generated consisting of an instance of the initial constraint (denoted "I" in FIG. 2A) at state $S_0$, K instances of the transition constraint (for each consecutive pair of states) and the disjunction of K–1 instances of the final constraint (for states $S_1 \ldots S_K$). In FIG. 2A, only the last instance of the final constraint is depicted, for clarity. In this example, this set of clauses is found to be unsatisfiable, indicating that there is no counterexample of 1 ... K steps. Over-approximator 140 then divides the clause set into two subsets. The first subset A includes the initial constraint and the first instance T1 of the transition constraint. The remaining clauses belong to subset B.

Proof partitioner 142 is then used to generate the first over-approximation OA1 as described above. In this embodiment, over-approximation OA1 is a formula that represents an over-approximation of the states reachable in one step. In this example, the process does not reach the fixed point in block 260 (meaning some states satisfy formula OA1 but do not satisfy the initial constraint 1). Thus, a second iteration is performed.

"In the second iteration of this example, the initial constraint I is replaced at state $S_0$ by over-approximation OA1. Again, in this example, no counterexample is found in block 240. Thus, over-approximator 140 uses the clauses from the first transition constraint T1 and the constraints from over-approximation OA1 to generate over-approximation OA2. In this embodiment, over-approximation OA2 is a formula that represents an over-approximation of the states reachable in two steps. Again, in this example, the process does not reach a fixed point in block 260, causing a third iteration to be performed."

"In the third iteration of this example, over-approximation OA1 is replaced at state $S_0$ by over-approximation OA2. Again, in this example, no counterexample is found in block 230. Thus, over-approximator 140 uses the clauses from the first transition constraint T1 and the constraints from over-approximation OA2 to generate over-approximation OA3. In this embodiment, over-approximation OA3 is a formula that represents an over-approximation of the states reachable in three steps. In this example, formula OA3 is found to imply the disjunction of I, OA1 and OA2 (that is, every state satisfying over-approximation OA3 also satisfies at least one of initial constraint I, over-approximation OA1, or over-approximation OA2) Thus, a fixed point is detected in block 260. This means that no reachable state can satisfy the final condition, hence there is no possible counterexample of any length, and the property is therefore true for the given design."

The above description describes embodiments in which the process starts with the initial constraints. In other embodiments, the process can start with the final constraints and work backwards.

Figure 3:
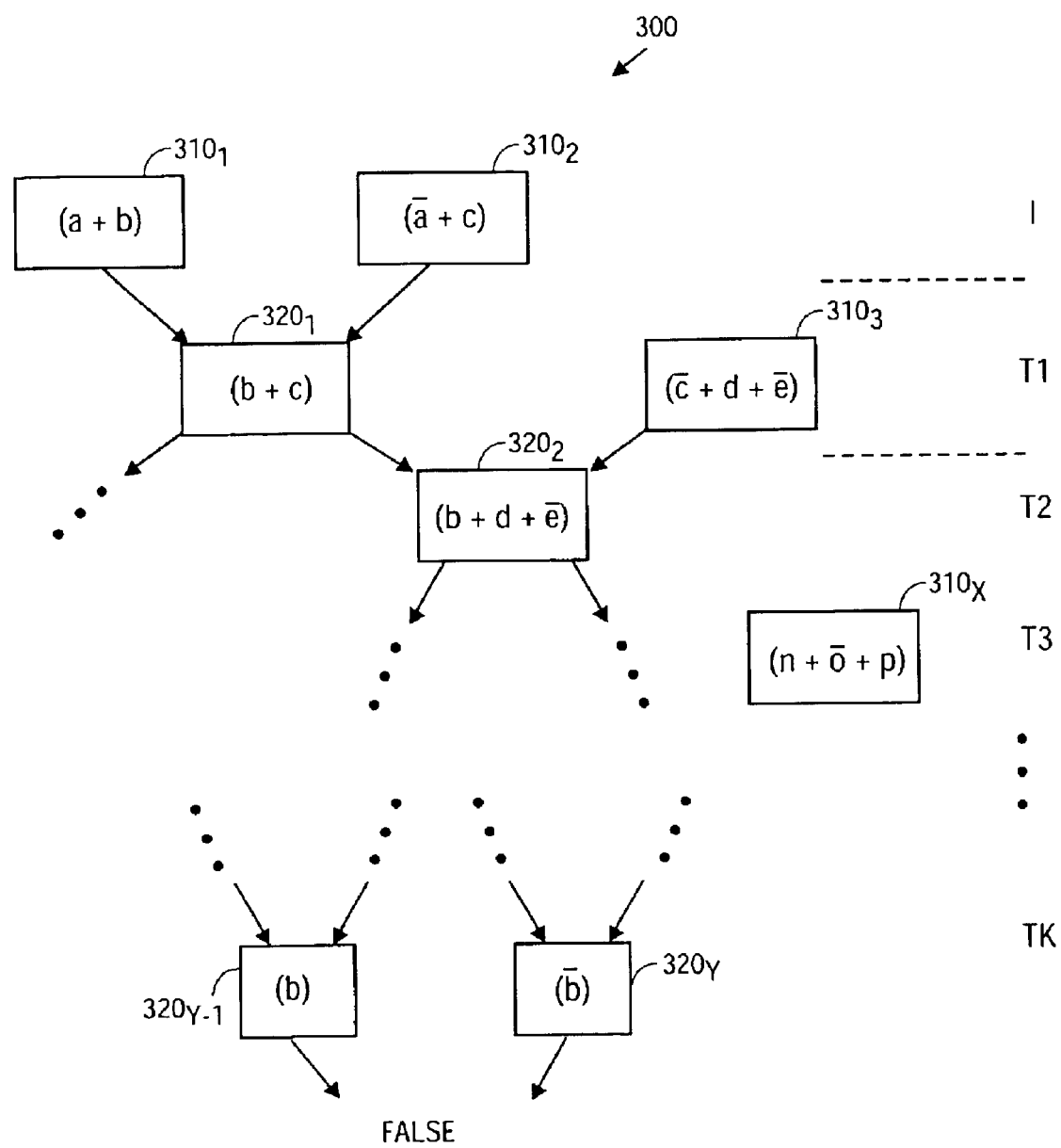
FIG. 3 is a diagram illustrating a proof generated by the bounded model checker of FIG. 1, according to one embodiment of the present invention.

FIG. 3 illustrates a proof 300 generated by the SAT solver component of bounded model checker 130 (FIG. 1) when no counterexample is found in K steps, according to one embodiment of the present invention. In this embodiment, proof 300 is in the form of a directed acyclic graph (DAG). The proof uses clauses $310_1, 310_2, \ldots, 310_X$, each of which is derived from some constraint in the transformed design description. For example, clause $310_1$ is (a+b), clause $310_2$ is (a+c), and clause $310_X$ is (n+$\bar{o}$+p). These clauses comprise the roots of the directed acyclic graph. The SAT solver component of Bounded model checker 130 infers clauses $320_1, 320_2, \ldots, 320_Y$ from these clauses and those previously inferred by an inference method known as "resolution". The unique leaf of the directed acyclic graph is always the clause "False" (a disjunction of zero literals). The fact that "False" can be derived from the original clause set shows that the clause set is unsatisfiable.

In this example, inference clause $320_1$ is (b+c), generated by taking the resolvent of constraint clauses $310_1$ and $310_2$. Similarly, inference clause $320_2$ is generated by taking the resolvent of inference clause $320_1$ and constraint clause $310_3$. This process of taking the resolvent of constraint and/or inference clauses is continued, resulting in the last two clauses $320_{Y-1}$ and $320_Y$. In this example, the last two clauses $320_{Y-1}$ and $320_Y$ are unsatisfiable (i.e., the literals b and b complement cannot both be true), indicating that no counterexample exists in K steps.

Figure 4:
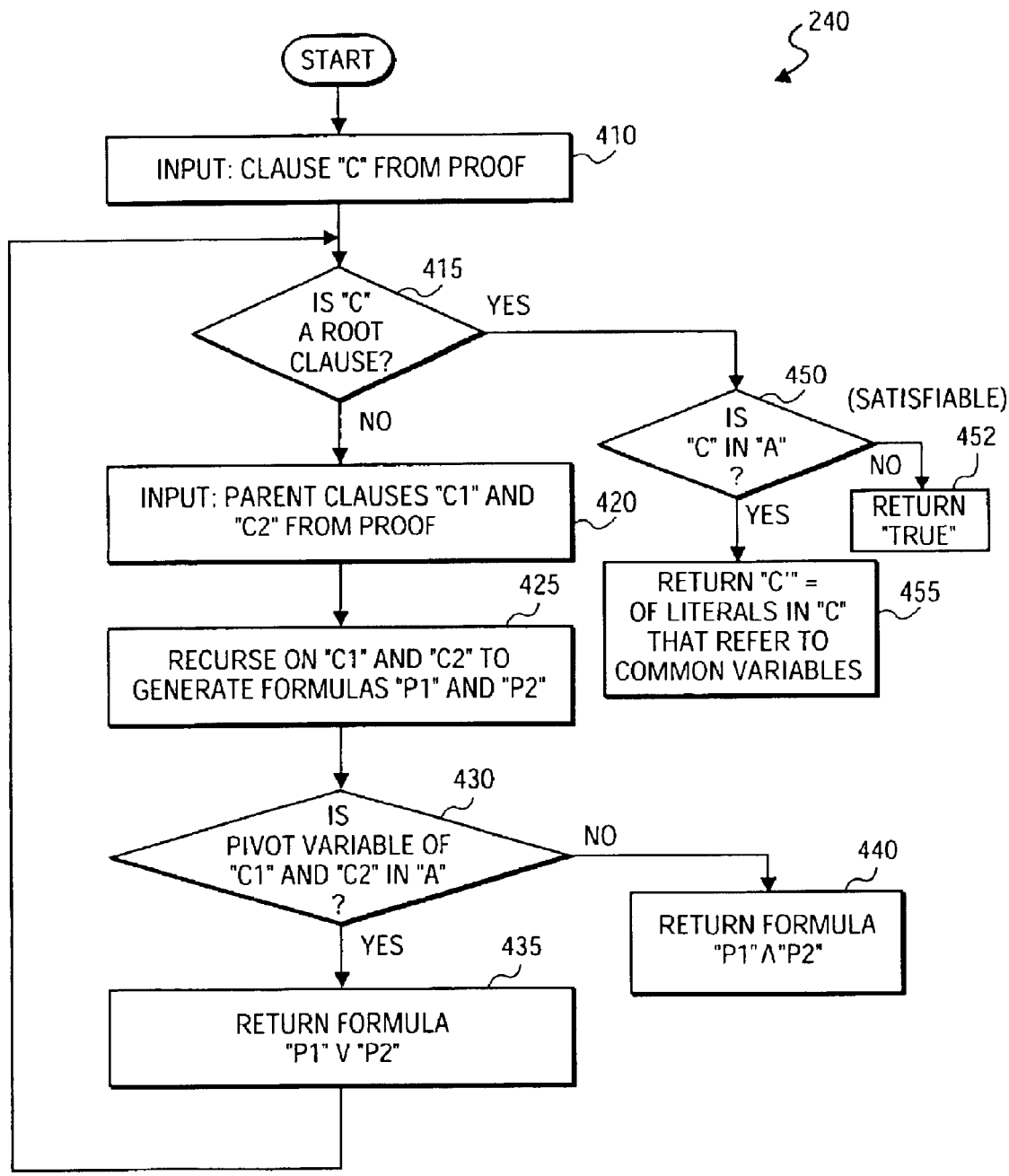
FIG. 4 is a flow diagram illustrating in more detail the operational flow in partitioning a proof, according to one embodiment of the present invention.

FIG. 4 illustrates the operational flow of proof partitioner 142 (FIG. 1), according to one embodiment of the present invention. In this embodiment, proof partitioner 142 is implemented as a procedure to be executed by a computer system. The input of this procedure is a proof of unsatisfiability of a given clause set, as described above, and a division the clause set into two disjoint subsets A and B. As previously mentioned, the output of the procedure is a formula P with the properties: (a) it is logically implied by A; (b) it refers only to the common variables of subsets A and B; and (c) its conjunction with the clause subset B is unsatisfiable (i.e., formula P and subset B are inconsistent). The procedure is recursive, with its recursion parameter C being a clause in the proof. The initial value of C is the unique leaf clause of the proof, which is always the clause representing "False" (a disjunction of zero literals).

Referring to FIG. 4, the clause C is first tested in blocks 410 and 415 to determine whether it is a root clause in the proof (i.e., a clause in the original clause set, which has no parent in the directed acyclic graph).

If clause C is not a root clause, the operational flow proceeds to a block 420 in which proof partitioner 140 retrieves parent clauses C1 and C2 of clause C from the proof. In a block 425, proof partitioner 142 recurses on parent clauses C1 and C2 to generate formulas P1 and P2, respectively. By tabling the results of such recursions, the number of recursions can be limited to the number of clauses in the graph, as is commonly done in the case of recursive procedures.

In a decision block 430, proof partitioner 142 determines whether the "pivot variable" of clauses C1 and C2 (i.e., the unique variable common to both of clauses C1 and C2) occurs in subset A of the clauses. If so, the procedure returns the formula representing the logical OR of formulas P1 and P2, as represented by a block 435.

On the other hand, if the pivot variable does not occur in subset A of the clauses, the procedure returns the formula representing the logical AND of formulas P1 and P2, as represented by a block 440.

Returning to decision block 415, if clause C is a root clause, the operational flow proceeds to a decision block 450. In block 450, proof partitioner 142 determines whether clause C is in subset A of the original clauses. If so, the procedure returns the disjunction (logical OR) of all the literals in clause C that refer to common variables of subsets A and B. If not, proof partitioner 142 returns the Boolean formula "True".

It can be shown that the above recursive procedure, when started with the leaf clause "False" of the proof of unsatisfiability, returns a formula P with the above stated properties, that is, that formula P is implied by the clause subset A, is inconsistent with the clause subset B, and refers only to common variables of subsets A and B. This makes the formula P suitable for use as an over-approximation in block 240 (FIG. 2).

Figure 5:
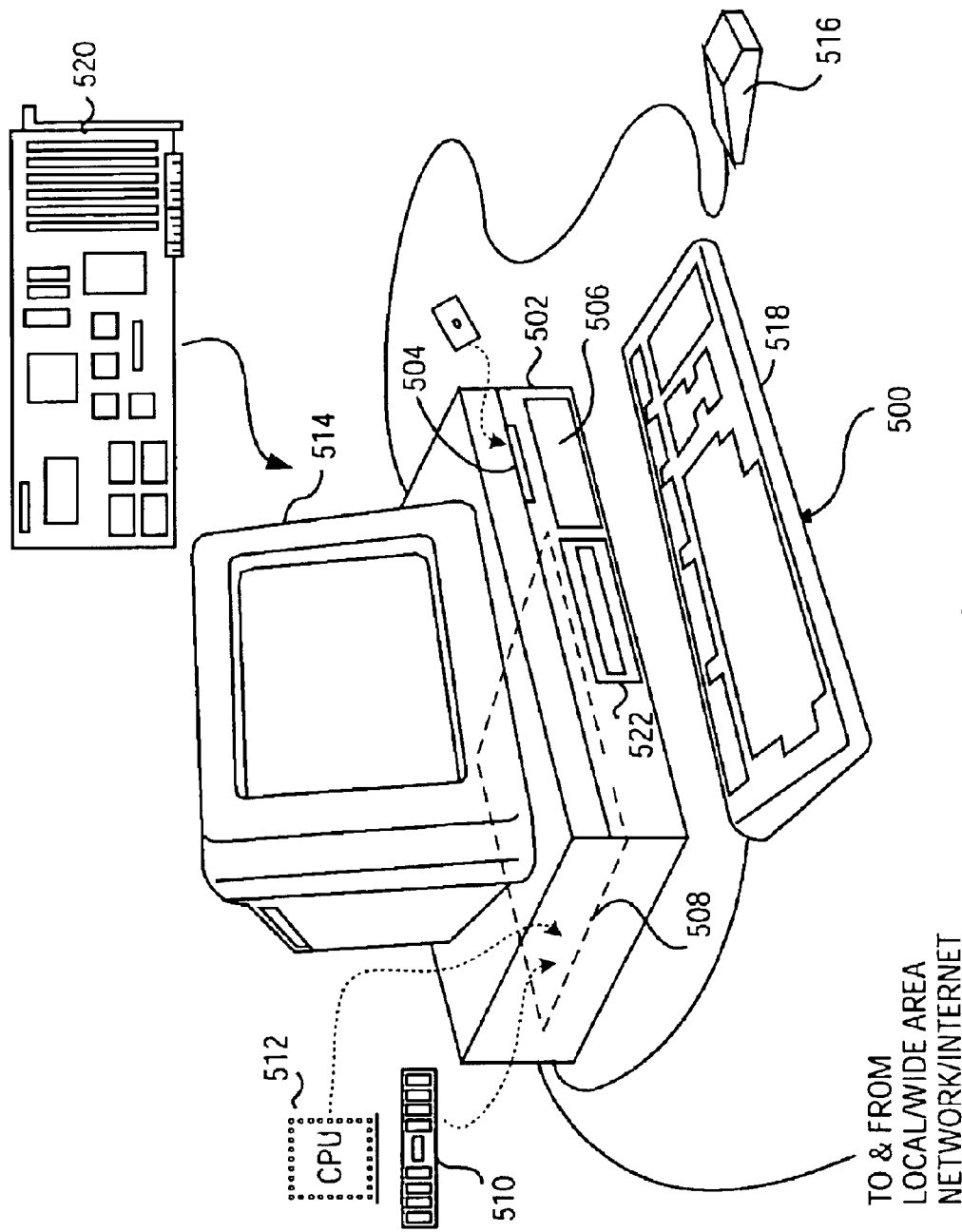
FIG. 5 is a diagram illustrating an exemplary computer for use with embodiments of the present invention.

FIG. 5 illustrates a generally conventional computer 500, which is suitable for use as client machines, application servers, and database servers in connection with practicing the present invention. Computer 500 may be used for running client and server-side software that includes one or more software modules that implement the various operations of the invention discussed above. Examples of computers that may be suitable for client machines as discussed above include (but are not limited to) PC-class systems operating the Windows operating systems, workstations (e.g., Sun workstations) operating a UNIX-based operating system (e.g., the Solaris operating system), and various computer architectures that implement LINUX operating systems. Computer 500 is also intended to encompass various server architectures, as well as computers having multiple processors.

In this embodiment, computer 500 includes a processor chassis 502 in which are mounted a floppy disk drive 504, a hard drive 506, a motherboard 508 populated with appropriate integrated circuits including memory 510 and one or more processors (CPUs) 512, and a power supply (not shown), as are generally well known to those of ordinary skill in the art. It will be understood that hard drive 506 may be implemented as a single unit, or multiple hard drives, and may optionally reside outside of computer 500.

A monitor 514 is included for displaying graphics and text generated by software programs and program modules that are run by the computer. A mouse 516 (or other pointing device) may be connected to a serial port (or to a bus port or USB port) on the rear of processor chassis 502. Signals from mouse 516 are conveyed to the motherboard to control a cursor on the display and to select text, menu options, and graphic components displayed on monitor 514 by software programs and modules executing on the computer. In addition, in this embodiment, a keyboard 518 is coupled to the motherboard for user entry of text and commands that affect the running of software programs executing on the computer. In this exemplary embodiment, computer 500 also includes a network interface card 520 or built-in network adapter for connecting the computer to a computer network, such as a local area network, wide area network, or the Internet.

Embodiments of computer 500 may also optionally include a compact disk-read only memory (CD-ROM) drive 522 into which a CD-ROM disk may be inserted so that executable files and data on the disk can be read for transfer into the memory and/or into storage on hard drive 506 of computer 500. Other mass memory storage devices such as an optical recorded medium or DVD drive may be included. The machine readable instructions comprising the software that causes computer 500 to implement the functions of the present invention can be distributed on floppy disks or CD-ROMs (or other memory media) and stored in the hard drive until loaded into random access memory (RAM) for execution by the CPU. Optionally, all or a portion of the machine instructions may be loaded via a computer network.

Embodiments of a design verifier using proof-based abstraction are described herein. In the above description, numerous specific details are set forth (such as the SAT solver, proof partitioner, etc.) to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring the description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In addition, embodiments of the present description may be implemented not only within a semiconductor chip but also within machine-readable media. For example, the designs described above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

Thus, embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium can include such as a read only memory (ROM); a random access memory (RAM); a magnetic disk storage media; an optical storage media; and a flash memory device, etc. In addition, a machine-readable medium can include propagated signals such as electrical, optical, acoustical or other form of propagated signals (e.g., carrier waves, infrared signals, digital signals, etc.).

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent modifications are possible, as those skilled in the relevant art will recognize.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. A method for verifying a property of a design of a system, the method comprising:
    performing bounded model checking on a design description for the system to a depth of K steps to search for a counterexample, the design description including a plurality of constraints each referring to states of components within the system;
    providing access to a proof generated during the performing of the bounded model checking;
    if a counterexample of a depth of K steps is not found in the performing of the bounded model checking, then
        deriving from the proof an over-approximation of the set of states reachable after one or more steps, and
        determining whether the over-approximation is at a fixed point; and
    repeating the performing of the bounded model checking, the providing access, the deriving and the determining until either a fixed point is reached for the over-approximation or a counterexample is found for a value of K.

2. The method of claim 1, further comprising:
    if the over-approximation is not at the fixed point, then iteratively performing bounded model checking using the over-approximation as an initial constraint.

3. The method of claim 1, further comprising:
    if the over-approximation is at the fixed point, then providing an indication that the property is true for the design description.

4. The method of claim 1, further comprising;
    if a counterexample is found, then
        determining whether the bounded model checking was performed using an over-approximation as the initial condition.

5. The method of claim 1, further comprising:
    if a counterexample was found and the bounded model checking was performed using an over-approximation, then
        increasing K and
        repeating the performing of the bounded model checking without using any over-approximations.

6. The method of claim 1, further comprising:
    if a counterexample was found and the bounded model checking was performed without using an over-approximation, then
        providing an indication that the property is false.

7. The method of claim 1, wherein
    a Boolean satisfiability solver is used in performing the bounded model checking.

8. An apparatus for verifying a property of a design for a system, the apparatus comprising:
    means for performing bounded model checking on a design description for the system to a depth of K steps to search for a counterexample, the design description including a plurality of constraints referring to states of components within the system;
    means for accessing a proof generated during the bounded model checking;
    means for deriving from the proof an over-approximation of the set of states reachable after one or more steps, when a counterexample of a depth of K steps is not found in the performing of the bounded model checking; and
    means for determining if the over-approximation is at a fixed point; and
    means for repeating the performing of the bounded model checking, the accessing of the proof, the deriving and the determining until either a fixed point is reached for the over-approximation or a counterexample is found for a value of K.

9. The apparatus of claim 8 further comprising:
    means for providing the over-approximation to the means for performing bounded model checking to use as one of the plurality of constraints.

10. The apparatus of claim 8 further comprising:
    means for indicating that the property is true if the over-approximation is at a fixed point.

11. The apparatus of claim 8, further comprising:
    means for selectively determining whether the means for performing bounded model checking used an over-approximation.

12. The apparatus of claim 8, further comprising:
    means for increasing K if a counterexample was found and the means for performing bounded model checking used an over-approximation.

13. The apparatus of claim 8, further comprising:
    means for providing an indication that the property is false if a counterexample was found and the means for performing bounded model checking used an over-approximation.

14. The apparatus of claim 8, wherein
the means for performing bounded model checking includes a Boolean satisfiability solver.

15. A machine-readable media having stored thereon instructions that when executed by a machine causes the machine to perform operations in verifying a design of a system, the operations comprising:
performing bounded model checking on a design description for the system to a depth of K steps to search for a counterexample, the design description including a plurality of constraints referring to states of components within the system;
providing access to a proof generated during the performing of the bounded model checking;
if a counterexample of a depth of K steps is not found in performing the bounded model checking, then
deriving from the proof an over-approximation of the set of states reachable after one or more steps, and
determining whether the over-approximation is at a fixed point; and
repeating the performing of the bounded model checking, the providing access, the deriving and the determining until either a fixed point is reached for the over-approximation or a counterexample is found for a value of K.

16. The machine-readable media of claim 15, further comprising instructions that when executed by the machine causes the machine to perform operations comprising:
iteratively performing the bounded model checking using the over-approximation as an initial constraint if the over-approximation is not at the fixed point.

17. The machine-readable media of claim 15, further comprising instructions that when executed by the machine causes the machine to perform operations comprising:
if the bounded model checking was performed using an over-approximation and a counterexample was found, then
increasing K and
repeating the performing of the bounded model checking without using any over-approximations.

18. The machine-readable media of claim 15, further comprising instructions that when executed by the machine causes the machine to perform operations comprising:
if a counterexample was found and the performing of bounded model checking did not use an over-approximation, then
providing an indication that a property is false.

19. The machine-readable media of claim 15, further comprising instructions that when executed by the machine causes the machine to perform operations comprising:
providing an indication that a property is true if the over-approximation is at a fixed point.

20. The machine-readable media of claim 15, wherein
a Boolean satisfiability solver is used in the performing of the bounded model checking.

21. The machine-readable media of claim 15, further comprising instructions that when executed by the machine causes the machine to perform operations comprising:
transforming a Boolean design description of the system to include constraints in a conjunctive normal form.

22. A machine-readable media having machine-executable modules for verifying a property of a design for system, the modules comprising:
a bounded model checker having a proof generator to verify a property of a design description by searching for a counterexample to a depth of K steps, the design description including a plurality of constraints referring to states of components in the system;
an over-approximator to provide an over-approximation of reachable states in one or more steps using a proof generated by the proof generator, if the bounded model checker finds no counterexample in K steps; and
a fixed-point detector to detect if the over-approximation is at a fixed point when the bounded model checker finds no counterexample in K steps, and if not, to output to the bounded model checker to replace a constraint with the over-approximation.

23. The machine-readable media of claim 22, wherein
the bounded model checker verifies the property to a depth of K steps using the over-approximation if the over-approximation is not at the fixed point.

24. The machine-readable media of claim 22, wherein
the bounded model checker verifies the property to a depth of greater than K steps if a counterexample was found and the bounded model checker used an over-approximation.

25. The machine-readable media of claim 22, wherein
the bounded model checker comprises a Boolean satisfiability solver.

26. The machine-readable media of claim 22, wherein
the modules further comprise an interface to transform a Boolean design description to include constraints in conjunctive normal form.

27. The machine-readable media of claim 22, wherein
the modules further comprise an interface to indicate that the property is true if the over-approximation is at the fixed point.

28. The machine-readable media of claim 22, wherein
the modules further comprise an interface to indicate that the property is false if the bounded model checker found a counterexample and did not use an over-approximation as a constraint.

29. The machine-readable media of claim 22, wherein
the over-approximator includes a proof-partitioner to derive an over-approximation formula to provide the over-approximation of reachable states in the one or more steps.

30. The machine-readable media of claim 29, wherein
the bounded model checker further has
a Boolean satisfiability (SAT) solver to determine whether or not a conjunction of an initial constraint and a final constraint of respective initial and final states of components in the system is satisfiable, and
if so, then there is a counterexample for a depth of zero steps with K equal to zero and the property of the design description is false.

* * * * *